(12) United States Patent
Shikibu et al.

(10) Patent No.: US 10,593,645 B2
(45) Date of Patent: Mar. 17, 2020

(54) SEMICONDUCTOR DEVICE HAVING A PLURALITY OF CHIPS BEING STACKED

(71) Applicant: FUJITSU LIMITED, Kawasaki-shi, Kanagawa (JP)

(72) Inventors: Takahiro Shikibu, Kawasaki (JP); Yusuke Hamada, Kawasaki (JP); Osamu Moriyama, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 350 days.

(21) Appl. No.: 15/216,824

(22) Filed: Jul. 22, 2016

(65) Prior Publication Data

US 2017/0033085 A1  Feb. 2, 2017

(30) Foreign Application Priority Data

Jul. 31, 2015  (JP) ................................. 2015-151935

(51) Int. Cl.
*G11C 7/10* (2006.01)
*H01L 25/065* (2006.01)
(Continued)

(52) U.S. Cl.
CPC ........ *H01L 25/0657* (2013.01); *G11C 7/1057* (2013.01); *H01L 23/49541* (2013.01);
(Continued)

(58) Field of Classification Search
CPC ................. H01L 25/0657; H01L 24/02; H01L 2924/15311; H01L 2225/06541;
(Continued)

(56) References Cited

U.S. PATENT DOCUMENTS 5,406,701 A * 4/1995 Pepe ...................... H01L 24/16
228/180.22
5,982,601 A * 11/1999 Lin ...................... H01L 27/0262
361/111
(Continued)

FOREIGN PATENT DOCUMENTS

JP  2003-60053 A  2/2003
JP  2011-81883 A  4/2011
(Continued)

OTHER PUBLICATIONS

Japanese Office Action dated Jan. 8, 2019 for corresponding Japanese Patent Application No. 2015-151935, English Translation, 5 pages.

*Primary Examiner* — Charles D Garber
*Assistant Examiner* — S M Sohel Imtiaz
(74) *Attorney, Agent, or Firm* — Fujitsu Patent Center

(57) ABSTRACT

A semiconductor device, includes: a first semiconductor chip including: a first substrate; a first via; a first rear surface-side pad connected to the first via; a first wiring layer; a first front surface-side pad formed on the first wiring layer; and an input circuit formed in the first substrate, an input signal wire connecting the first via, the first front surface-side pad, and an input terminal of the input circuit; and a second semiconductor chip including: a second substrate; a second wiring layer; a second front surface-side pad; and an output circuit formed in the second substrate, an output signal wire connecting the second front surface-side pad to an output terminal of the output circuit. The second semiconductor chip is stacked on a rear surface side of the first semiconductor chip, and the first rear surface-side pad and the second front surface-side pad are connected.

10 Claims, 14 Drawing Sheets

(51) Int. Cl.
  *H01L 23/00* (2006.01)
  *H01L 23/495* (2006.01)
  *H01L 23/538* (2006.01)

(52) U.S. Cl.
  CPC .......... *H01L 23/5384* (2013.01); *H01L 24/02* (2013.01); *H01L 24/06* (2013.01); *H01L 24/14* (2013.01); *H01L 24/16* (2013.01); *H01L 24/17* (2013.01); *H01L 2224/02381* (2013.01); *H01L 2224/0401* (2013.01); *H01L 2224/0557* (2013.01); *H01L 2224/05569* (2013.01); *H01L 2224/0603* (2013.01); *H01L 2224/06181* (2013.01); *H01L 2224/1403* (2013.01); *H01L 2224/14181* (2013.01); *H01L 2224/16146* (2013.01); *H01L 2224/16148* (2013.01); *H01L 2224/16238* (2013.01); *H01L 2224/17181* (2013.01); *H01L 2225/06513* (2013.01); *H01L 2225/06517* (2013.01); *H01L 2225/06541* (2013.01); *H01L 2225/06565* (2013.01); *H01L 2924/1431* (2013.01); *H01L 2924/1434* (2013.01); *H01L 2924/15311* (2013.01)

(58) Field of Classification Search
  CPC . H01L 2225/06565; H01L 2225/06513; H01L 2225/06517; H01L 23/5384; H01L 23/49541; G11C 7/1057
  See application file for complete search history.

(56) References Cited

U.S. PATENT DOCUMENTS

| | | | | |
|---|---|---|---|---|
| 2002/0167348 A1* | 11/2002 | Kim | .................... | G11C 5/005 327/310 |
| 2003/0040131 A1* | 2/2003 | Kai | .................... | H01L 23/481 438/14 |
| 2003/0102568 A1* | 6/2003 | Tomishima | ...... | G01R 31/31723 257/777 |
| 2004/0076041 A1* | 4/2004 | Akiyoshi | ......... | H03K 3/356121 365/200 |
| 2005/0285263 A1* | 12/2005 | Ogawa | ............... | H01L 25/0657 257/723 |
| 2008/0217767 A1* | 9/2008 | Tago | .................... | H01L 23/481 257/737 |
| 2009/0065950 A1* | 3/2009 | Lee | ......................... | H01L 23/66 257/777 |
| 2009/0278245 A1* | 11/2009 | Bonifield | .............. | H01L 23/481 257/676 |
| 2010/0020583 A1* | 1/2010 | Kang | ........................ | G11C 5/02 365/51 |
| 2010/0072604 A1* | 3/2010 | Komatsu | ............... | H01L 23/481 257/691 |
| 2010/0140800 A1* | 6/2010 | Hagihara | .............. | H01L 21/563 257/737 |
| 2010/0213600 A1* | 8/2010 | Lau | ........................ | H01L 23/055 257/693 |
| 2011/0309518 A1* | 12/2011 | Kim | .................... | H01L 25/0657 257/774 |
| 2013/0135010 A1* | 5/2013 | Kondo | ...................... | G11C 5/02 326/82 |
| 2014/0210068 A1* | 7/2014 | Bartley | ................. | H01L 23/373 257/712 |
| 2014/0252632 A1* | 9/2014 | Barth | .................. | H01L 23/5384 257/773 |
| 2014/0269108 A1* | 9/2014 | Ishikawa | ............ | G01R 31/2884 365/189.05 |
| 2014/0361411 A1* | 12/2014 | Yamamichi | ....... | H01L 23/49838 257/621 |
| 2015/0279825 A1* | 10/2015 | Kang | ...................... | H01L 25/50 257/48 |
| 2015/0287441 A1* | 10/2015 | Fukushi | ................ | G11C 5/147 365/51 |
| 2015/0371970 A1* | 12/2015 | Sakurada | ................ | H01L 24/97 257/737 |
| 2015/0371971 A1* | 12/2015 | Yokoyama | .......... | H01L 23/3128 257/738 |
| 2016/0148907 A1* | 5/2016 | Segawa | ................. | H01L 23/522 257/369 |
| 2017/0077066 A1* | 3/2017 | Hamada | .............. | H01L 25/0657 |

FOREIGN PATENT DOCUMENTS

| | | |
|---|---|---|
| JP | 2012-255704 | 12/2012 |
| JP | 2013-531891 | 8/2013 |
| WO | 2011/156887 | 12/2011 |

\* cited by examiner

SEMICONDUCTOR DEVICE HAVING A PLURALITY OF CHIPS BEING STACKED

CROSS-REFERENCE TO RELATED APPLICATION

This application is based upon and claims the benefit of priority of the prior Japanese Patent Application No. 2015-151935, filed on Jul. 31, 2015, the entire contents of which are incorporated herein by reference.

FIELD

The present invention relates to a semiconductor device.

BACKGROUND

A three-dimensional large scale integrated circuit (LSI) semiconductor device in which a plurality of LSI chips (or semiconductor bodies) are stacked has been proposed. For example, one type of three-dimensional LSI is a hybrid memory cube (HMC) configured by stacking a plurality of DRAM chips.

One technology for stacking a plurality of LSI chips in a three-dimensional LSI is a through silicon via (TSV), which is a via wire (or via) passing through a silicon substrate. By forming a TSV in the silicon substrate, it is possible to directly connect together a plurality of stacked LSI chips.

In order to connect chips together by TSV, micro-bump pads are provided on the front surface and rear surface of the chips. The micro-bump pads on the rear surface side of the chip are connected to the TSV, and the TSV are connected to the circuits inside the chip. Therefore, by connecting the micro-bump pads on the rear surface side of one of the two chips with the micro-bump pads on the front surface side of the other of the two chips, via the micro-bumps, the chips can be connected directly together. The micro-bumps are smaller than C4 bumps made by a controlled collapse chip connection (C4) method. Therefore, the size of the micro-bump pads is smaller than the C4 bump pads.

A three-dimensional LSI using TSV is described in Japanese Laid-open Patent Publication No. 2012-255704 and Japanese National Publication of International Patent Application No. 2013-531891.

SUMMARY

In a three-dimensional LSI in which a plurality of chips (or semiconductors) are stacked, the micro-bump pads provided on the front surface (multi-layer wiring layer side) or the rear surface (silicon substrate side) of the chips may be open and not connected to anything. Examples of this are the micro-bump pads on the rear surface of the chip which is in the uppermost layer of the plurality of stacked chips and the micro-bump pads on the front surface of the chip in the bottommost layer.

If the micro-bump pads in an open state are in an externally exposed state and are connected to the input gate electrode of the MOS transistor, then there is a risk of breakdown of the gate oxide film due to static electricity from external sources. Therefore, the micro-bump pads are connected to the power source terminal VDD or the ground terminal GND via a pull-up resistance or a pull-down resistance.

However, since the TSV are vias which directly connect the chips together, then it is expected that signals of high frequency will propagate therethrough. Therefore, connecting the pull-up resistance or pull-down resistance to the micro-bump pads connected to the TSV is not desirable since this increases the parasitic capacitance of the signal wires.

According to an aspect of the embodiments, a semiconductor device, includes: a first semiconductor chip including: a first substrate; a first via penetrating through the first substrate; a first rear surface-side pad formed on a rear surface side of the first substrate and connected to the first via; a first wiring layer formed on a front surface side of the first substrate; a first front surface-side pad formed on a front surface side of the first wiring layer; and an input circuit formed in the first substrate, the first wiring layer being provided with an input signal wire which connects the first via, the first front surface-side pad, and an input terminal of the input circuit; and a second semiconductor chip including: a second substrate, a second wiring layer formed on a front surface side of the second substrate; a second front surface-side pad formed on a front surface side of the second wiring layer; and an output circuit formed in the second substrate, the second wiring layer being provided with an output signal wire which connects the second front surface-side pad to an output terminal of the output circuit, wherein the second semiconductor chip is stacked on a rear surface side of the first semiconductor chip, and the first rear surface-side pad of the first semiconductor chip and the second front surface-side pad of the second semiconductor chip are connected to each other.

According to a first aspect of the invention, a semiconductor device is provided in which the parasitic capacitance of signal wires in micro-bump pads is suppressed.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

Figure 1:
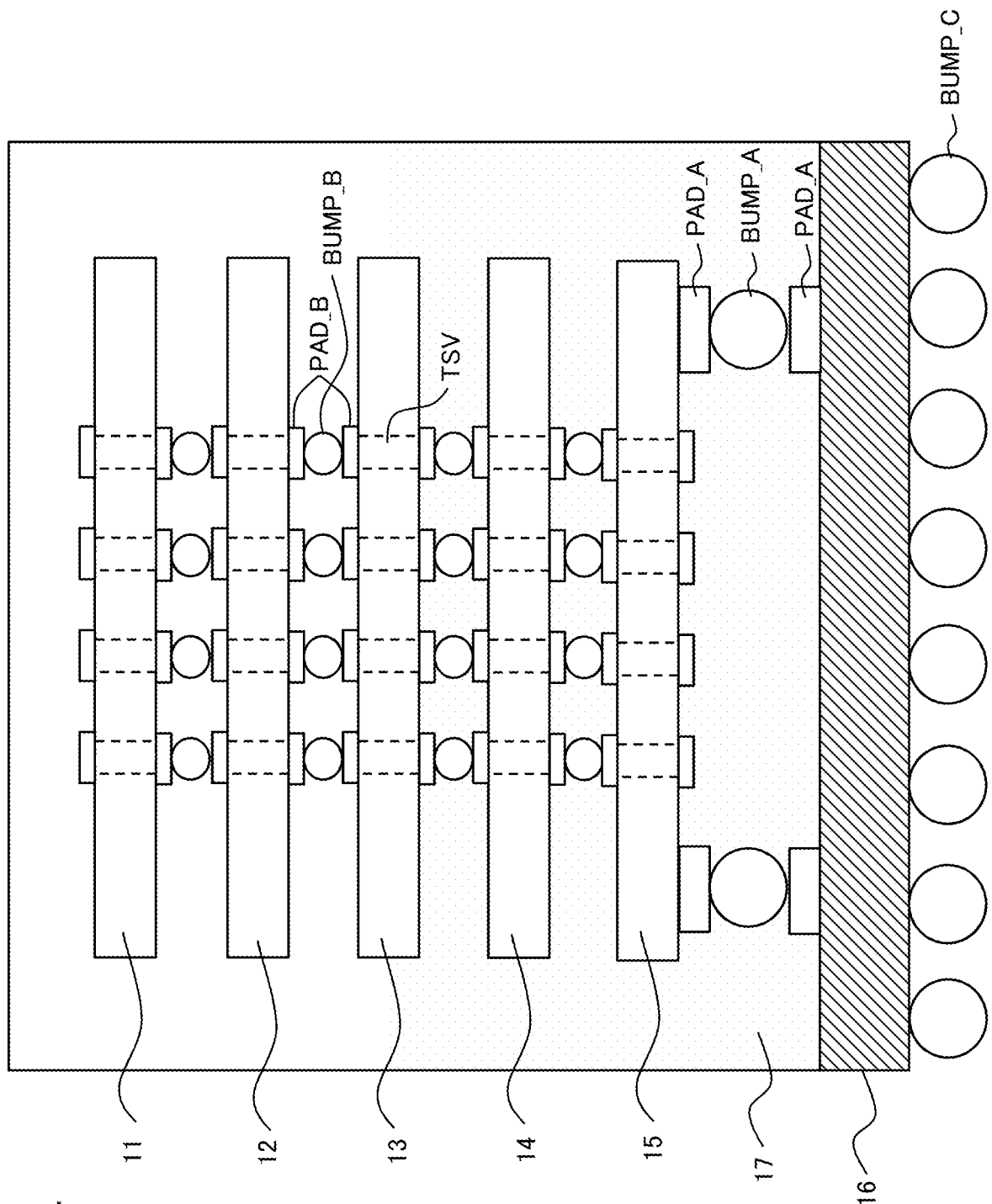
FIG. 1 is a cross-sectional diagram illustrating one example of a three-dimensional LSI.

FIG. 1 is a cross-sectional diagram illustrating one example of a three-dimensional LSI. The three-dimensional LSI in FIG. 1 has a package substrate 16 and five chips 11 to 15, which are each semiconductors and are stacked on top of the package substrate, and the five chips are sealed with an insulating sealing material 17. In the chips 11 to 15, formed are vias TSV which pass through the silicon substrate, and micro-bump pads PAD_B are provided on the front surface side and rear surface side of the chips. The chips which are adjacent to the upper and lower sides are connected directly via the micro-bumps BUMP_B.

In the present specification, a LSI chip is also called a semiconductor.

Furthermore, C4 bump pads PAD_A are provided on the chip 15 in the bottommost layer, and are connected with C4 bump pads PAD_A on the package substrate 16, via C4 bumps BUMP_A. Furthermore, the package substrate 16 is connected to a printed substrate, or the like (not illustrated), via bumps BUMP_C.

The three-dimensional LSI in FIG. 1 is a hybrid memory cube HMC in which, for example, four memory chips 11 to 14 are stacked on top of one logic chip 15. The logic chip 15 is, for example, a memory controller for the four memory chips 11 to 14. The memory controller outputs access commands and addresses, and data, in parallel, to the four memory chips 11 to 14, and receives read-out data that has been output from a memory chip selected from among the four memory chips 11 to 14.

Figure 2:
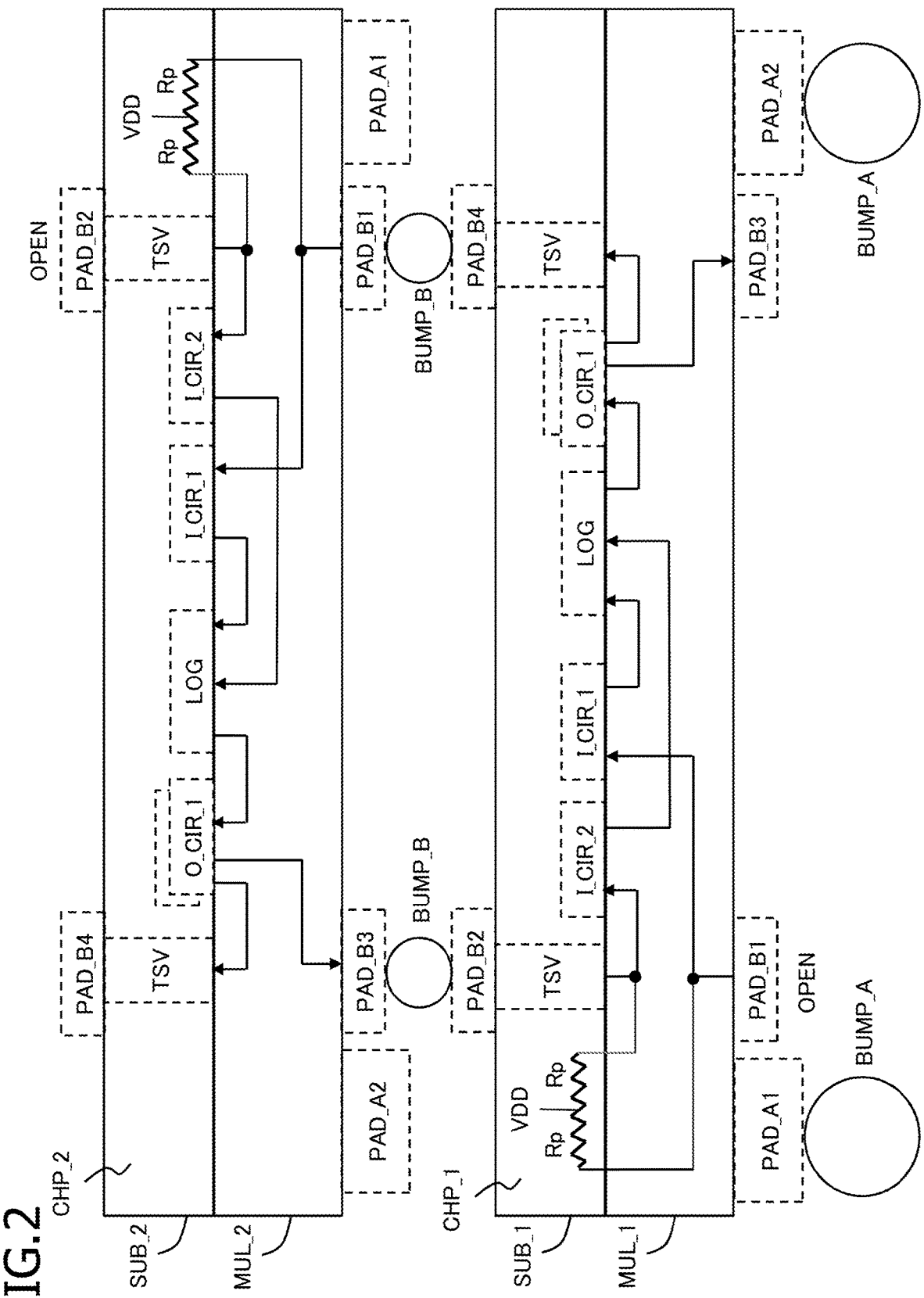
FIG. 2 is a diagram for illustrating the configuration of the chips in the three-dimensional LSI and the micro-bumps.

FIG. 2 is a diagram for illustrating the configuration of the chips in the three-dimensional LSI and the micro-bumps. In FIG. 2, two chips CHP_1, CHP_2 are stacked together. The lower-side chip CHP_1 has a semiconductor substrate SUB_1 made of silicon, for example, and a multi-layer wiring layer MUL_1 formed on the front surface side of the substrate SUB_1 (the lower side in FIG. 2). Moreover, circuits of various types, I_CIR, LOG, O_CIR, are formed on the front surface of the semiconductor substrate SUB_1, and the circuits are connected to each other by signal wires in the multi-layer wiring layer MUL_1. Furthermore, through silicon vias (called "vias" below) TSV are formed penetrating from the front surface side to the rear surface side of the semiconductor substrate SUB_1.

In the lower-side chip CHP_1, rear surface-side micro-bump pads PAD_B2, PAD_B4 connected to the vias TSV are formed on the rear surface side of the semiconductor substrate SUB_1 (the upper side in FIG. 2), and front surface-side micro-bump pads PAD_B1, PAD_B3 are formed on the front surface-side of the semiconductor substrate SUB_1, in other words, on the multi-layer wiring layer MUL_1. Moreover, C4 bump pads PAD_A1, PAD_A2 are formed on the multi-layer wiring layer MULL and are connected to pads on the substrate (not illustrated) via the C4 bumps BUMP_A.

On the other hand, the upper-side chip CHP_2, similarly to the lower-side chip CHP_1, has a semiconductor substrate SUB_2, and a multi-layer wiring layer MUL_2 formed on the front surface side (the lower side in FIG. 2). Moreover, circuits of various types I_CIR, LOG, O_CIR are formed on the front surface of the semiconductor substrate SUB_2, and the circuits are connected to each other by signal wires inside the multi-layer wiring layer MUL_2. Furthermore, through silicon vias (simply called "vias" below) TSV are formed penetrating from the front surface side to the rear surface side of the semiconductor substrate SUB_2. Rear surface-side micro-bump pads PAD_B2, PAD_B4 connected to the vias TSV are formed on the rear surface side of the semiconductor substrate SUB_2 (the upper side in FIG. 2), and front surface-side micro-bump pads PAD_B1, PAD_B3 are formed on the front surface side of the semiconductor substrate SUB_2, in other words, on the multi-layer wiring layer MUL_2.

The upper-side chip CHP_2 is disposed after rotating the lower chip CHP_1 through 180° in the stacking plane, and consequently, the left/right-hand sides are reversed in the cross-sectional diagrams. The rear surface-side pads PAD_B2, PAD_B4 on the lower-side chip CHP_1 are connected with the front surface-side pads PAD_B3, PAD_B1 on the upper-side chip CHP_2, respectively via micro-bumps BUMP_B.

Figure 3:
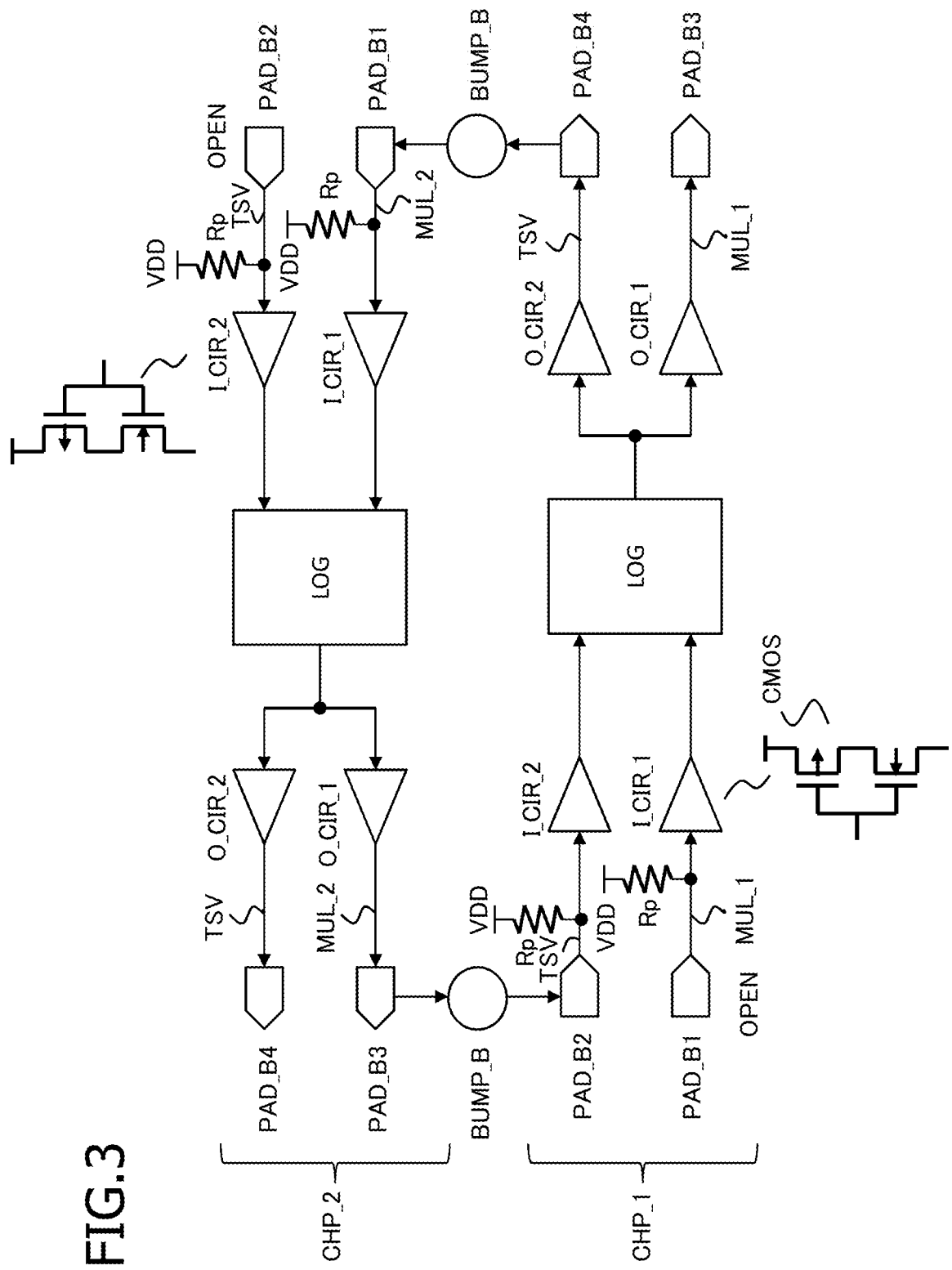
FIG. 3 is a diagram illustrating an overview of the circuits in two stacked chips in FIG. 2.

FIG. 3 is a diagram illustrating an overview of the circuits in two stacked chips in FIG. 2. The connections between the circuits and the pads in FIG. 2 are described here with reference to FIG. 3.

In the lower-side chip CHP_1, the front surface-side pad PAD_B1 is connected to the input circuit I_CIR_1 via the signal wire inside the multi-layer wiring layer MUL_1, and the rear surface-side pad PAD_B2 is connected to a separate input circuit I_CIR_2 through a via TSV. The input circuits I_CIR_1, I_CIR_2 have, for example, a CMOS circuit CMOS, and the input signals input from the front surface-side pad PAD_B1 and the rear surface-side pad PAD_B2 are connected respectively to the input gate terminals of the CMOS circuits.

On the other hand, the outputs of the input circuits I_CIR_1, I_CIR_2 are input to the logic circuit LOG, the output of the logic circuit LOG is input to the output circuits O_CIR_1, O_CIR_2, the output of one output circuit O_CIR_1 is connected to the front surface-side pad PAD_B3 via a signal wire in the multi-layer wiring layer MUL_1, and the output of the other output circuit O_CIR_2 is connected to the rear surface-side pad PAD_B4 through a via TSV.

The upper-side chip CHP_2 also has a similar connection relationship and circuit configuration to the lower-side chip CHP_1. The upper-side chip CHP_2 is rotated through 180° with respect to the lower-side chip CHP_1 in the stacking plane, and in the cross-sectional diagrams, the left/right-side relationships are reversed, and therefore, in the circuit diagram in FIG. 3, the circuitry of the upper-side chip CHP_2 has a reverse left/right relationship with respect to the lower-side chip CHP_1.

The rear surface-side pads PAD_B2, PAD_B4 on the lower-side chip CHP_1 in FIGS. 2 and 3, and the front surface-side pads PAD_B3, PAD_1 of the upper-side chip CHP_2 are respectively connected via the micro-bumps BUMP_B. Therefore, the front surface-side pad PAD_B1 on the lower-side chip CHP_1 and the rear surface-side pad PAD_B2 on the upper-side chip CHP_2 are both input terminals, but both are not connected to anywhere and are in an open state OPEN. In this way, the micro-bump pads PAD_B1, PAD_B2 connected to the input circuit may also be connected to the pads PAD_B4, PAD_B3 of another chip, and may also be in an open state OPEN. If the pads are in an open state, then there is a risk of breakdown of the input circuit due to static electricity.

Therefore, the pads PAD_B1, PAD_B2 connected to the input circuit are connected via a pull-up resistance Rp (or pull-down resistance) to the power wire VDD (or ground wire), for example. The pads PAD_B1, PAD_B2 are connected to the power wire VDD via a pull-up resistance Rp, and therefore even if there is an open state in the three-dimensional LSI, breakdown of the internal circuitry is prevented by discharging the applied static electricity to the power wire VDD.

However, connecting the pull-up resistance Rp (or pull-down resistance) to the pads PAD_B1, PAD_B2 which are connected to the vias TSV that directly connect the chips together means raising the parasitic capacitance of the connection wiring between the chips which propagate high-frequency signals, and thus increasing the CR time constant. Therefore, the waveform of the propagated high-frequency signals becomes blunted, which is not desirable.

On the other hand, the pads PAD_B3, PAD_B4 are connected to the output terminals of the CMOS circuit in the output circuits O_CIR_1, O_CIR_2, and hence there is no risk of causing breakdown of the gate oxide film in the CMOS circuit in the output circuit, even if static electricity is applied. Consequently, the power wire VDD (or the ground wire) is never connected to the pads PAD_B3, PAD_B4 that are connected to the output circuit, via a pull-up resistance (or pull-down resistance).

Figure 4:
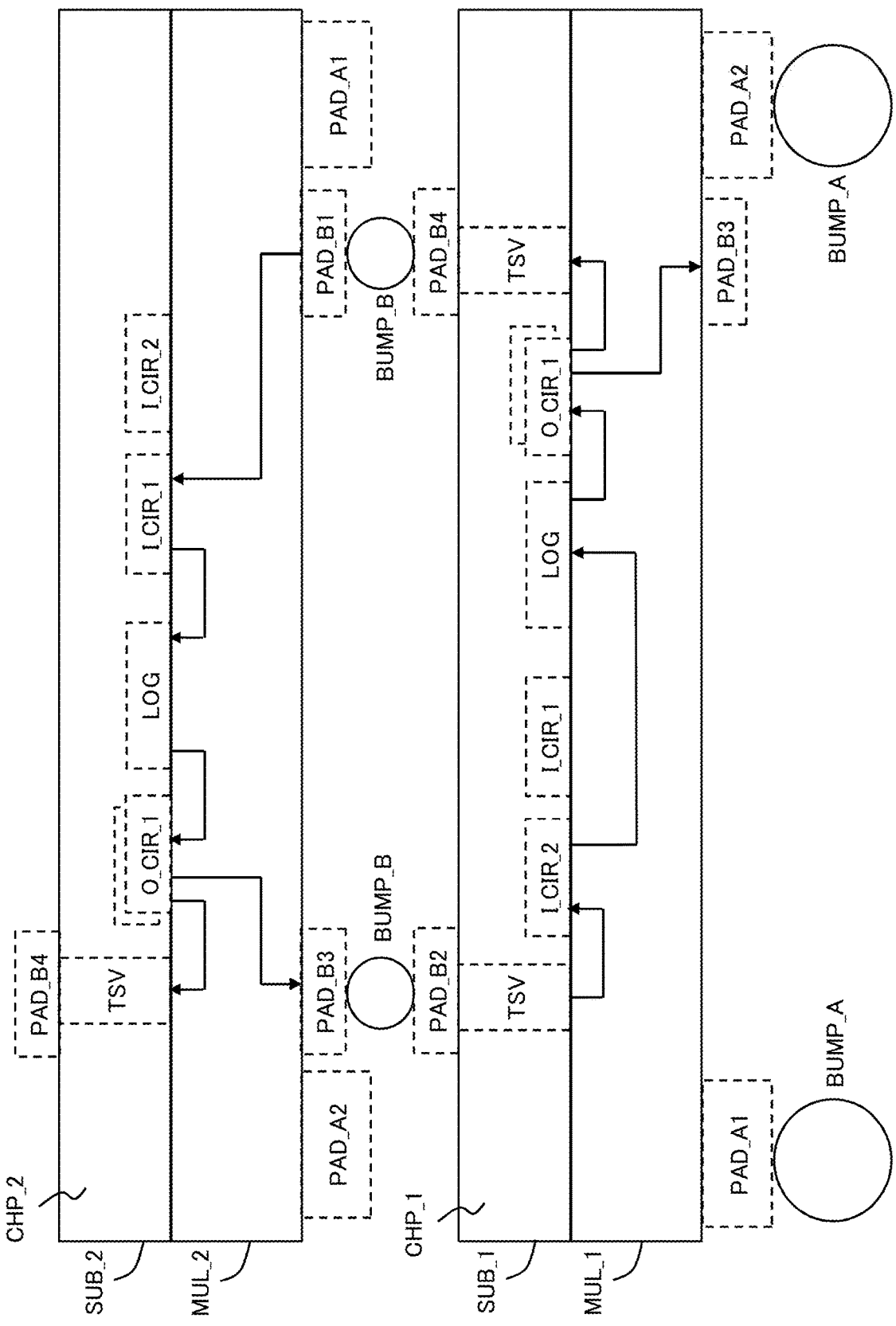
FIG. 4 is a diagram illustrating the configuration and micro-bumps of the three-dimensional LSI which differ from FIG. 2.

FIG. 4 is a diagram illustrating the configuration and micro-bumps of the three-dimensional LSI which differ from FIG. 2. The configuration of the two chips CHP_1, CHP_2 in FIG. 4 is the same as the configuration of the two chips CHP_1, CHP_2 in FIG. 2, with the exception of the front surface-side pad of the lower-side chip CHP_1 and the rear surface-side pad of the upper-side chip CHP_2.

As can be seen by comparing the cross-sectional diagram in FIG. 4 with FIG. 2, the lower-side chip CHP_1 in FIG. 4 is not provided with a front surface-side pad PAD_B1 which is connected to the input circuit I_CIR_1, and the upper-side chip CHP_2 is not provided with a rear surface-side pad PAD_B2 connected to the input circuit I_CIR_2. In other words, in FIG. 2, by adopting a structure which does not include the PAD_B1 of the lower-side chip CHP_1 and the pad PAD_B2 of the upper-side chip CHP_2, which are in an open state when the chips are stacked, then no pull-up resistance Rp (or pull-down resistance) is provided in the wiring between the chips.

As a result of this, in the example in FIG. 4, the lower-side chip CHP_1 and the upper-side chip CHP_2 have mutually different configurations in respect of the pads which are connected to the input terminals of the input circuit, and the pads PAD_B2, PAD_B1 connected to the inputs of the input circuits I_CIR_1, I_CIR_2 are not in an open state when the chips are stacked. Therefore, the pads PAD_B2, PAD_B1 connected to the input circuits I_CIR_1, I_CIR_2 are not connected to the power wire (or ground wire) via a pull-up resistance Rp (or pull-down resistance), as in FIG. 2.

However, as illustrated in FIG. 4, the lower-side chip CHP_1 and the upper-side chip CHP_2 need to have respectively different configurations in respect of the pads which are connected to the input terminals of the input circuit, and the costs involve in the manufacturing process increase.

First Embodiment

Figure 5:
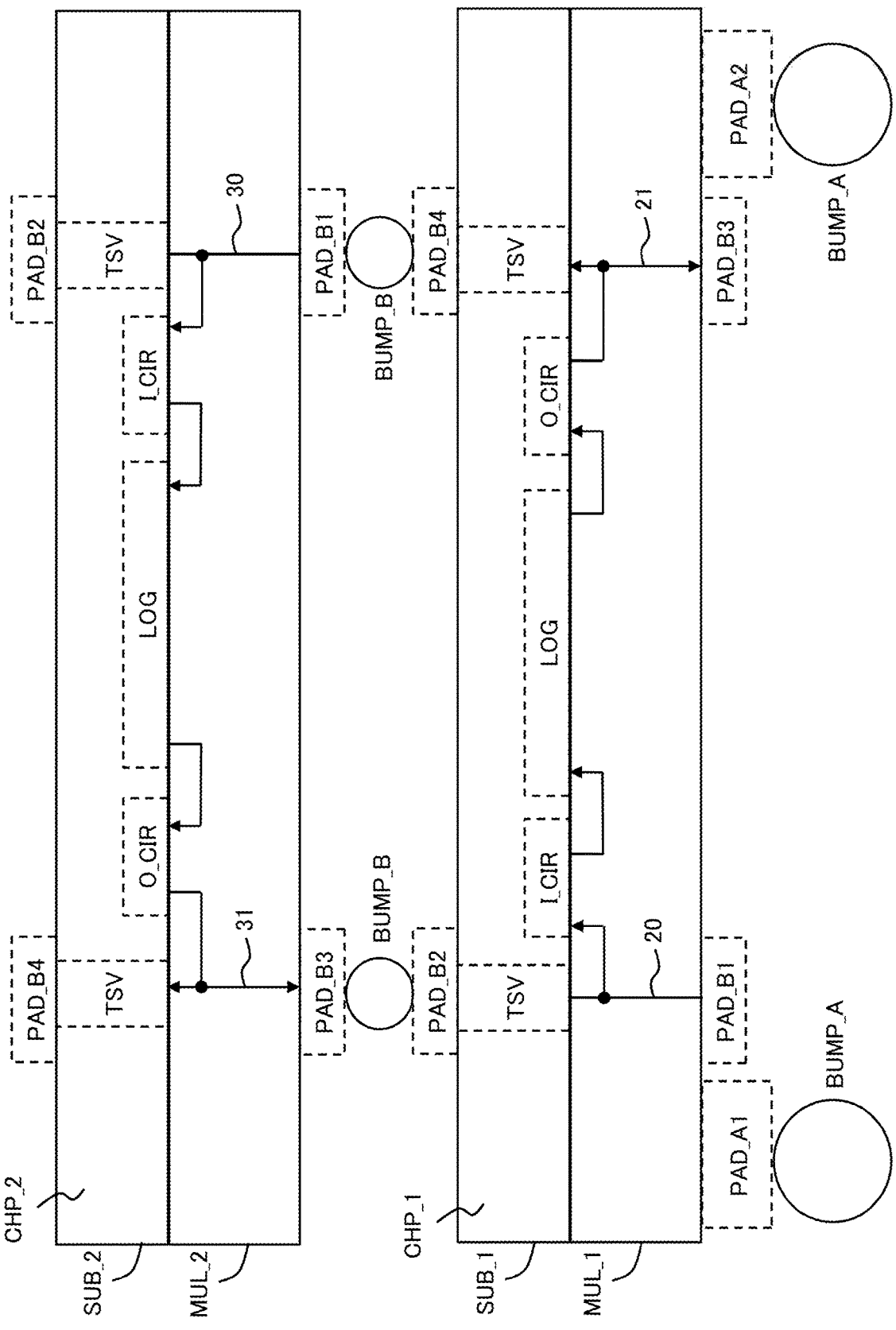
FIG. 5 is a diagram illustrating a semiconductor device having a plurality of stacked chips according to the first embodiment.

FIG. 5 is a diagram illustrating a semiconductor device having a plurality of stacked chips according to the first embodiment. In FIG. 5, two chips CHP_1, CHP_2 are stacked.

The lower-side chip CHP_1 has a semiconductor substrate SUB_1 made of silicon, or the like, and a multi-layer wiring layer MUL_1 formed on the front surface side of the substrate SUB_1. Moreover, an input circuit, a logic circuit and an output circuit, I_CIR, LOG, O_CIR are formed on the front surface of the semiconductor substrate SUB_1, and these circuits are connected together by signal wires inside the multi-layer wiring layer MUL_1. Furthermore, through silicon vias (called "vias" below) TSV which penetrate from the front surface side to the rear surface side are formed in the semiconductor substrate SUB_1.

In the lower-side chip CHP_1, rear surface-side micro-bump pads PAD_B2, PAD_B4 which are connected to the vias TSV are formed in the rear surface side of the semiconductor substrate SUB_1, and front surface-side micro-bump pads PAD_B1, PAD_B3 are formed on the front surface side of the semiconductor substrate SUB_1, in other words, on the multi-layer wiring layer MUL_1. Moreover, C4 bump pads PAD_A1, PAD_A2 are formed on the multi-layer wiring layer MUL_1, and are connected to pads on the substrate (not illustrated) via C4 bumps BUMP_A.

The micro-bump pads PAD_B have a size corresponding to the size of the micro-bumps BUMP_B, and the C4 bumps PAD_A have a size corresponding to the size of the C4 bumps BUMP_A. The micro-bumps BUMP_B have a size smaller than the C4 bumps BUMP_A. Therefore, the micro-bump pads PAD_B have a narrower surface area and a lower height than the C4 bump pads PAD_A.

On the other hand, the upper-side chip CHP_2 has the same configuration as the lower-side chip CHP_1. The lower-side chip CHP_1 is disposed at a rotation of 180° in the stacking plane, and has a reverse left/right configuration, and the C4 bump pads are not illustrated. In other words, the upper-side chip CHP_2 and the lower-side chip CHP_1 have the same configuration except for the C4 bump pads. Thus far, the configuration is the same as FIG. 2.

In FIG. 5, in the lower-side chip CHP_1, the front surface-side micro-bump pad PAD_B1 and the rear surface-side micro-bump pad PAD_B2, which are connected to the input of the input circuit I_CIR, are commonly connected through a via TSV and the input signal wire 20. Similarly, in the upper-side chip CHP_2, the front surface-side micro-bump pad PAD_B1 and the rear surface-side micro-bump pad PAD_B2, which are connected to the input of the input circuit I_CIR, are commonly connected through a via TSV and the input signal wire 30. The front surface-side micro-bump pads PAD_B1, PAD_B2 which are for input in the two chips CHP_1, CHP_2 are not configured so as to be connected to the power wire (or ground wire) via a pull-up resistance (or pull-down resistance).

In FIG. 5, in the lower-side chip CHP_1, the front surface-side micro-bump pad PAD_B3 and the rear surface-side micro-bump pad PAD_B4, which are connected to the output of the output circuit O_CIR, are commonly connected through a via TSV and the output signal wire 21. In the upper-side chip CHP_2, similarly to the lower-side chip CHP_1, the front surface-side micro-bump pad PAD_B3 and the rear surface-side micro-bump pad PAD_B4, which are connected to the output of the output circuit O_CIR, are commonly connected through a via TSV and the output signal wire 31.

Figure 6:
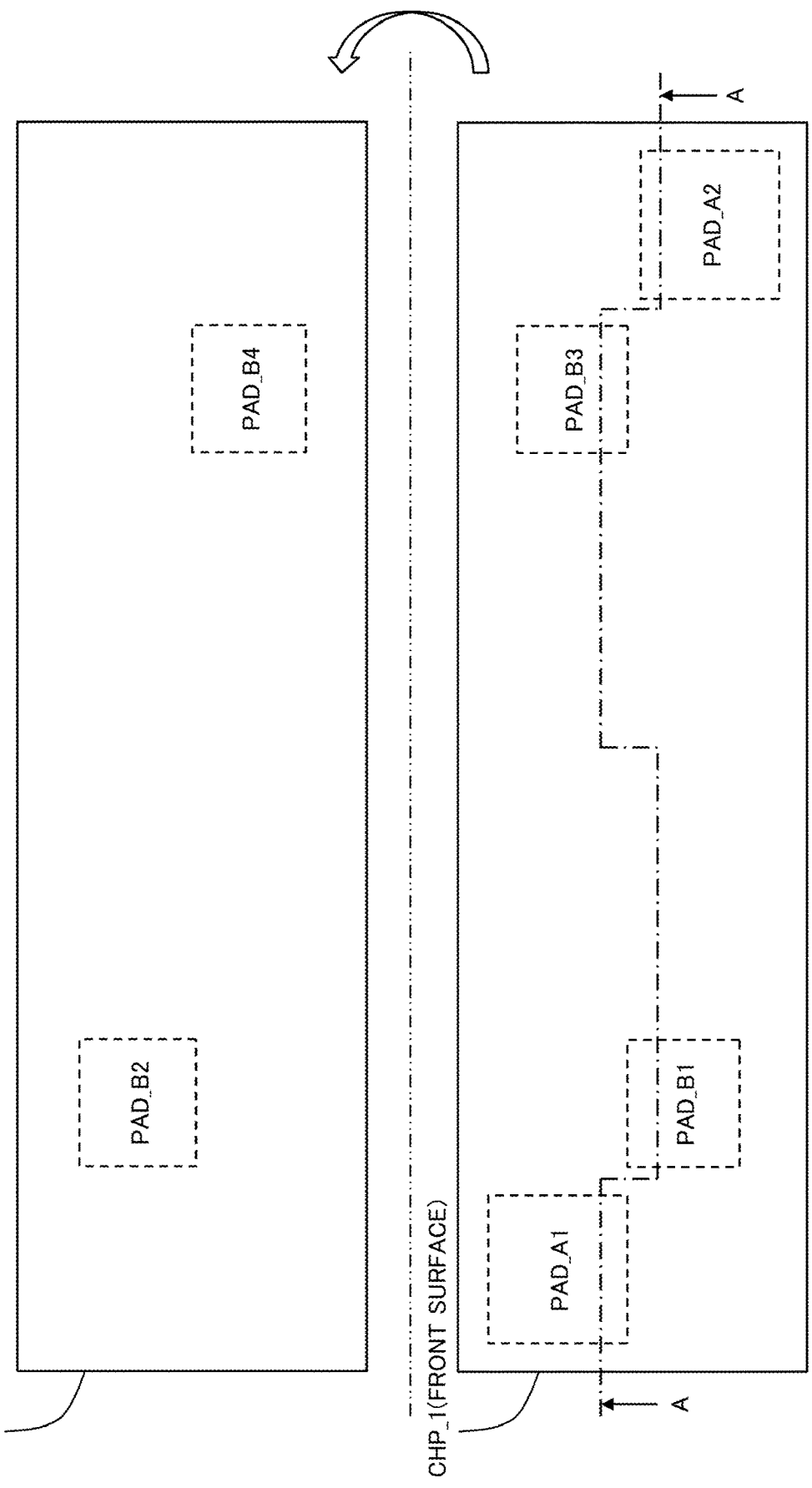
FIG. 6 is a plan diagram of the rear surface side and front surface side of the lower-side chip CHP_1 in FIG. 5.

FIG. 6 is a plan diagram of the rear surface side and front surface side of the lower-side chip CHP_1 in FIG. 5. As stated above, the rear surface-side micro-bump pads PAD_B2, PAD_B4 are formed on a diagonal on the rear surface side of the lower-side chip CHP_1. On the other hand, as stated above, the rear surface-side micro-bump pads PAD_B1, PAD_B3 are formed on a diagonal on the front surface side of the lower-side chip CHP_1, and furthermore, C4 bump pads PAD_A1, PAD_A2 are formed. When the surfaces are inverted via the double-dotted line between the rear surface side and the front surface side, then the rear surface-side micro-bump pads PAD_B2, PAD_B4, and the front surface-side micro-bump pads PAD_B1, PAD_B3 are at the same position in a plan view of the chips. In the drawings, the cross-section along the single-dotted line A-A corresponds to the cross-sectional view in FIG. 5.

The plan diagram on the rear surface side and front surface side of the upper-side chip CHP_2 in FIG. 5 is also similar to FIG. 6. The positional relationship between the front surface-side micro-bump pads on the lower-side chip CHP_1 and the upper-side chip CHP_2, and the rear surface-side micro-bump pads, is rotated through 180° in the stacking plane of the two chips.

Figure 7:
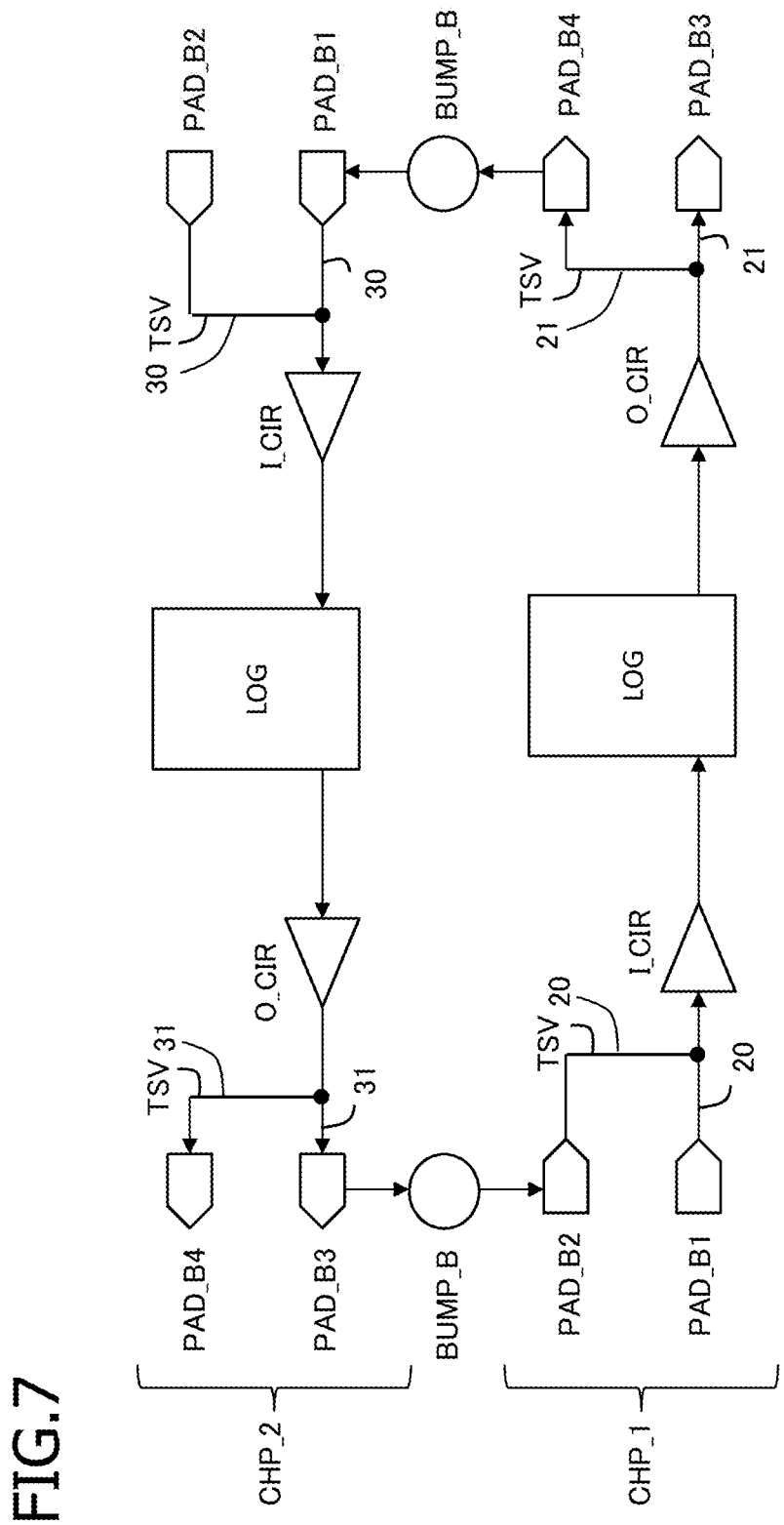
FIG. 7 is a diagram illustrating an overview of the circuitry of the two stacked chips in FIG. 5.

FIG. 7 is a diagram illustrating an overview of the circuitry of the two stacked chips in FIG. 5. The connection relationships between the circuits and pads in FIG. 5 are described here with reference to FIG. 7.

In the lower-side chip CHP_1, the front surface-side pad PAD_B1 is connected to the input terminal of the input circuit I_CIR via an input signal wire 20 in the multi-layer wiring layer MULL and the rear surface-side pad PAD_B2 is also connected to the input terminal of the same input circuit I_CIR through a via TSV and the input signal wire 20. The input circuit I_CIR has a CMOS circuit (not illustrated), and the input signals which are input from the front surface-side pad PAD_B1 and the rear surface-side pad PAD_B2 are connected to the input gate terminal of the CMOS circuit.

On the other hand, the output of the input circuit I_CIR is input to the logic circuit LOG, the output of the logic circuit LOG is input to the output circuit O_CIR, and the output of the output circuit O_CIR is connected to the front surface-side pad PAD_B3 via the output signal wire 21 in the multi-layer wiring layer MUL_1, and is also connected to the rear surface-side pad PAD_B4 through a via TSV and the output signal wire 21.

The upper-side chip CHP_2 has a similar connection relationship and circuit configuration to the lower-side chip CHP_1. The upper-side chip CHP_2 is rotated through 180° with respect to the lower-side chip CHP_1 and has a reverse left/right relationship in the cross-sectional drawing, and therefore, in the circuit diagram in FIG. 3 also, the circuitry of the upper-side chip CHP_2 has a reverse left/right relationship with respect to the circuitry of the lower-side chip CHP_1.

Similarly to FIGS. 2 and 3, the rear surface-side pads PAD_B2, PAD_B4 on the lower-side chip CHP_1 in FIGS. 5 and 7, and the front surface-side pads PAD_B3, PAD_B1 of the upper-side chip CHP_2 are connected respectively via micro-bumps BUMP_B. Therefore, the front surface-side pad PAD_B1 on the lower-side chip CHP_1 and the rear surface-side pad PAD_B2 on the upper-side chip CHP_2 are both input terminals, but are not connected to anywhere externally.

However, the front surface-side pad PAD_B1 of the lower-side chip CHP_1 is connected to the rear surface-side pad PAD_B2 of the same lower-side chip CHP_1, via the input signal wire 20 and the via TSV, and furthermore, the rear surface-side pad PAD_B2 is connected to the front surface-side micro-bump pad PAD_B3 of the upper-side chip CHP_2 via the micro-bump BUMP_B. Therefore, the front surface-side pad PAD_B1 of the lower-side chip CHP_1 is connected to the output terminal of the output circuit O_CIR of the upper-side chip CHP_2, and consequently is not in an open state. Moreover, the output terminal of the output circuit of the upper-side chip CHP_2 is normally a drain terminal of the CMOS circuit, and hence static electricity can escape to the substrate from the drain terminal and there is no risk of breakdown of the gate oxide film due to static electricity.

Similarly, the rear surface-side pad PAD_B2 on the upper-side chip CHP_2 is connected to the front surface-side pad PAD_B1 on the same upper-side chip CHP_2 via the input signal wire 30 and the via TSV, and furthermore, the front surface-side pad PAD_B1 is connected to the rear surface-side micro-bump pad PAD_B4 on the lower-side chip CHP_1 via the micro-bump pad BUMP_B. Therefore, the rear surface-side pad PAD_B2 of the upper-side chip CHP_2 is also connected to the output terminal of the output circuit O_CIR of the lower-side chip CHP_1, and consequently is not in an open state.

The front surface-side micro-bump pad PAD_B1 and the rear surface-side micro-bump pad PAD_B2, which are connected to the inputs of the input circuits in the two chips CHP_1, CHP_2, are connected to each other through vias TSV and the input signal wires 20, 30. Therefore, even if either one of the bumps is not connected externally, when the chips are in a stacked state, the other pad is connected to the output circuit of the other chip stacked therewith, and will not be in an open state. Accordingly, the pads PAD_B1, PAD_B2 connected to the inputs of the input circuits are not connected to the power wire, etc., via a pull-up resistance. Consequently, the CR constant of the connection wires passing through the vias TSV which directly connect together the chips is suppressed, and a high-frequency signal can be propagated.

Moreover, as illustrated in FIGS. 5 and 6, the two chips CHP_1, CHP_2 according to the first embodiment have substantially the same configuration except for the C4 bump pads, and therefore the costs involved in manufacturing the chips can be reduced.

In FIG. 5, it is also possible to adopt a configuration which is not provided with a front surface-side micro-bump pad PAD_B3 that is connected to the output signal wire 21 of the lower-wide chip CHP_1. Similarly, it is also possible to adopt a configuration which is not provided with a via TSV and/or a rear surface-side micro-bump pad PAD_B4 connected to the output signal wire 31 of the upper-side chip CHP_2. However, the respective pads PAD_B3, PAD_B4 are connected to the output terminals of the CMOS circuit of the output circuit, and therefore are not in an open state, and can be provided as illustrated in FIG. 5. In other words, it is not necessary to omit the output-side pads in order to prevent an open state.

On the other hand, the configuration of the front surface-side pad PAD_B1, the via TSV and the rear surface-side pad PAD_B2, which are connected to the input signal wire 20 of the lower-side chip CHP_1, and the configuration of the front surface-side pad PAD_B1, the via TSV and the rear surface-side pad PAD_B2, which are connected to the input signal wire 30 of the upper-side chip CHP_2, are respectively connected by the input signal wires 20, 30 so as not to be in an open state. Consequently, a merit is obtained in that it is possible to reduce the manufacturing costs of the chip by having the same configuration.

Figure 8:
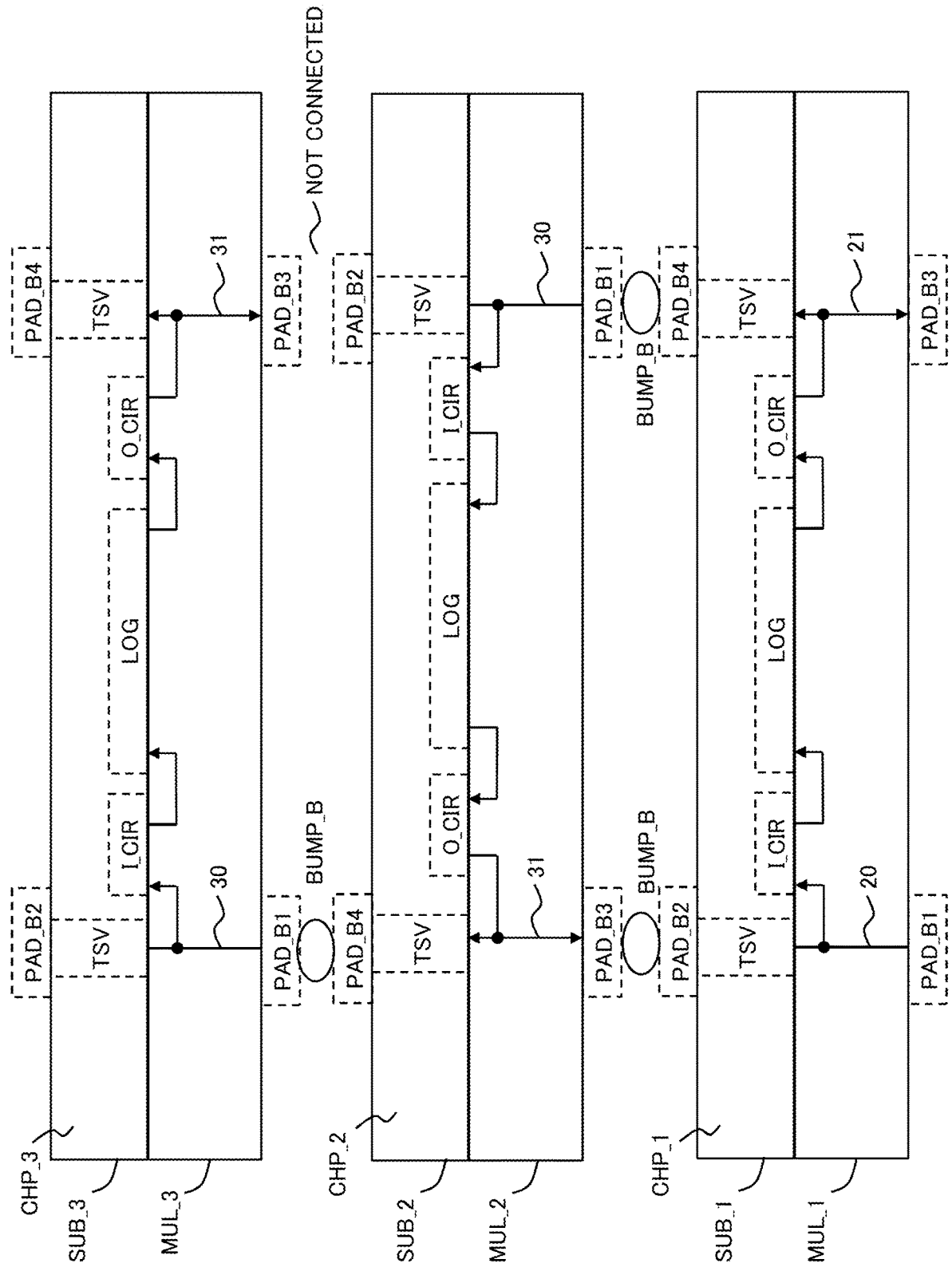
FIG. 8 is a diagram illustrating an example of a state in which three chips are stacked according to the first embodiment.

FIG. 8 is a diagram illustrating an example of a state in which three chips are stacked according to the first embodiment. The bottom-layer chip CHP_1 and the second-layer chip CHP_2 have the same configuration and connection relationships as FIG. 5. In FIG. 8, furthermore, a third-layer chip CHP_3 is stacked on top of the second-layer chip CHP_2. The third-layer chip CHP_3 is stacked after rotating the second-layer chip CHP_2 through 180° in the stacking plane, and has the same left/right configuration as the bottom-layer chip CHP_1.

The front surface-side micro-bump pad PAD_B1 connected to the input of the input circuit I_CIR of the second-layer chip CHP_2, and the rear surface-side micro-bump pad PAD_B4 connected to the output of the output circuit O_CIR of the bottom-layer chip CHP_1, are connected via a micro-bump BUMP_B. Therefore, the rear surface-side micro-bump pad PAD_B2 of the second-layer chip CHP_2 is stacked in an unconnected state with respect to the front surface-side micro-bump pad PAD_B3 of the third-layer chip CHP_3. This is because, otherwise, an unsuitable connection relationship occurs in which both the output of the bottom-layer chip CHP_1 and the output of the third-layer chip CHP_3 are input to the input circuit I_CIR of the second-layer chip CHP_2.

If the third-layer chip CHP_3 in FIG. 8 is stacked after being rotated through 180° on the front surface side of the bottom-layer chip CHP_1, then the front surface-side pad PAD_B1 connected to the input circuit I_CIR of the chip CHP_1 and the rear surface-side pad PAD_B4 connected to the output circuit O_CIR of the chip CHP_3 stacked on the lower side thereof are in an unconnected state.

Second Embodiment

Figure 9:
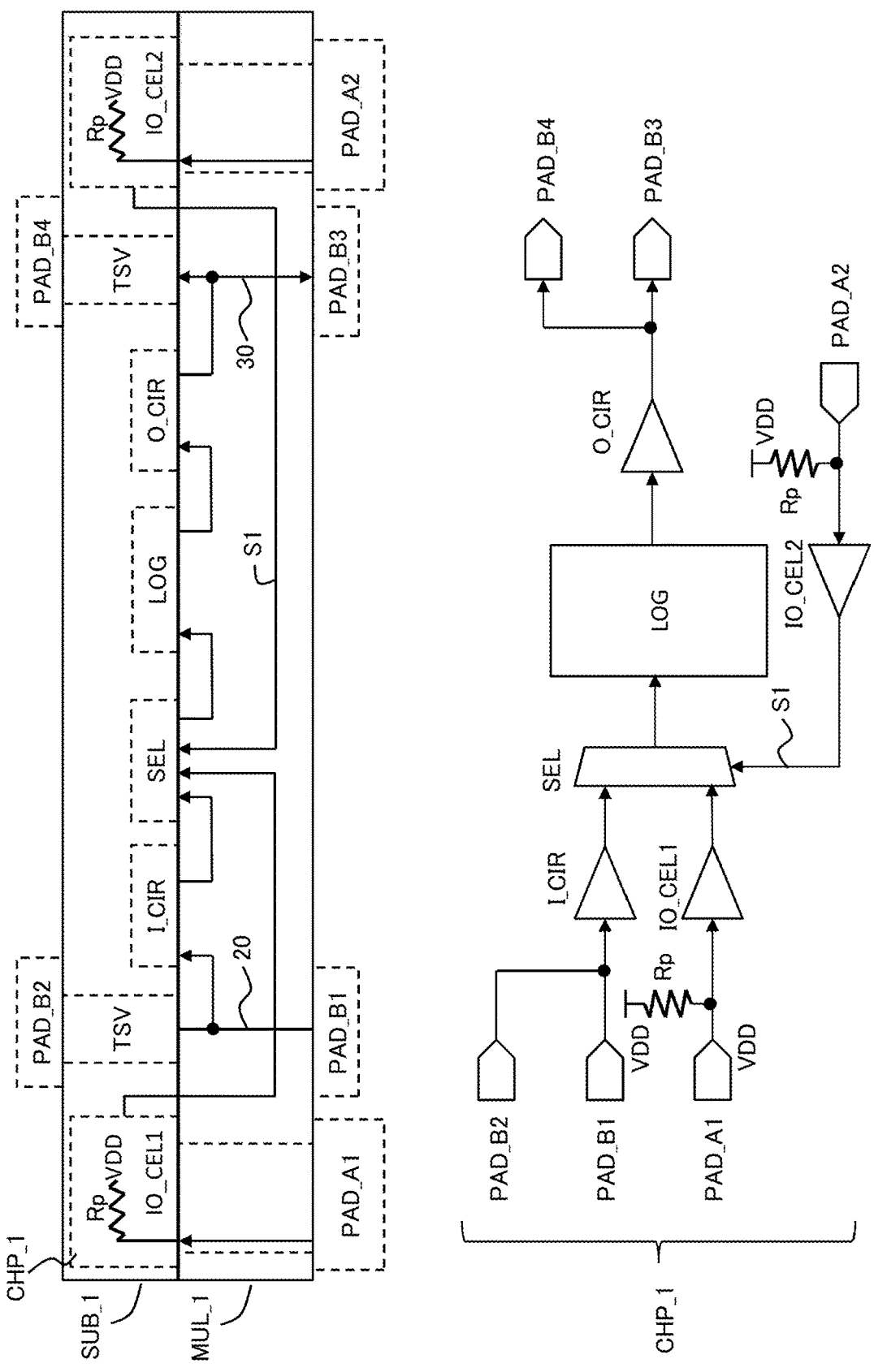
FIG. 9 is a diagram illustrating the cross-sectional configuration and circuitry of the chips according to a second embodiment of the invention.

FIG. 9 is a diagram illustrating the cross-sectional configuration and circuitry of the chips according to a second embodiment of the invention. The cross-sectional structure of the chip CHP_1 in FIG. 9, similarly to FIG. 5, is such that a front surface-side micro-bump pad PAD_B1 and a rear surface-side micro-bump pad PAD_B2 are connected through a via TSV and an input signal wire 20, and are both connected to an input terminal of an input circuit I_CIR. Therefore, similarly to FIG. 5, even if either one of the pads PAD_B1, PAD_B2 is not connected externally, the other thereof is connected to either of the pads PAD_B3, PAD_B4 on a different chip, and therefore will not be in an open state.

The chip CHP_1 in FIG. 9 differs from the chip CHP_1 in FIG. 5 in respect of the following points. Firstly, in the chip CHP_1 in FIG. 9, a C4 bump pad PAD_A1 is connected to the input of an input/output cell IO_CEL1, and the output of the input/output cell IO_CEL1 is input to a selector circuit SEL. Furthermore, a C4 bump pad PAD_A2 is connected to the input of an input/output cell IO_CEL2, and the output of the input/output cell IO_CEL2 is input to the selector circuit SEL. The input terminals of the input/output cells are connected to a power wire VDD (or a ground wire) via a pull-up resistance Rp (or pull-down resistance), thereby creating an escape path for static electricity which is input from the C4 bump pads PAD_A1, PAD_A2.

The circuit configuration of the chip CHP_1 in FIG. 9 has a selector SEL, in addition to the input circuit I_CIR, logic circuit LOG and output circuit O_CIR of the chip CHP_1 in FIG. 5. As illustrated in the circuit diagram in FIG. 9, the output of the input circuit I_CIR which receives inputs from the micro-bump pads PAD_B1, PAD_B2, and the output of the input/output cell IO_CEL1 which receives an input from the C4 bump pad PAD_A1, are input to the selector SEL. The output S1 of the input/output cell IO_CEL2 which receives an input from a further C4 bump pad PAD_A2 is input to the selector SEL as a selection signal for the selection SEL. Moreover, the output of the selector SEL is input to the logic circuit LOG. The logic circuit LOG, the output circuit O_CIR and the micro-bump pads PAD_B3, PAD_B4 which are connected to the outputs thereof are the same as in FIG. 5.

When the select signal input by the C4 bump pad PAD_A2 is at ground potential, then the select signal S1 assumes level L, and the selector SEL selects one of the inputs, and when the select signal is at the power potential VDD, then the select signal S1 assumes level H, and the selector SEL selects the other input.

Figure 10:
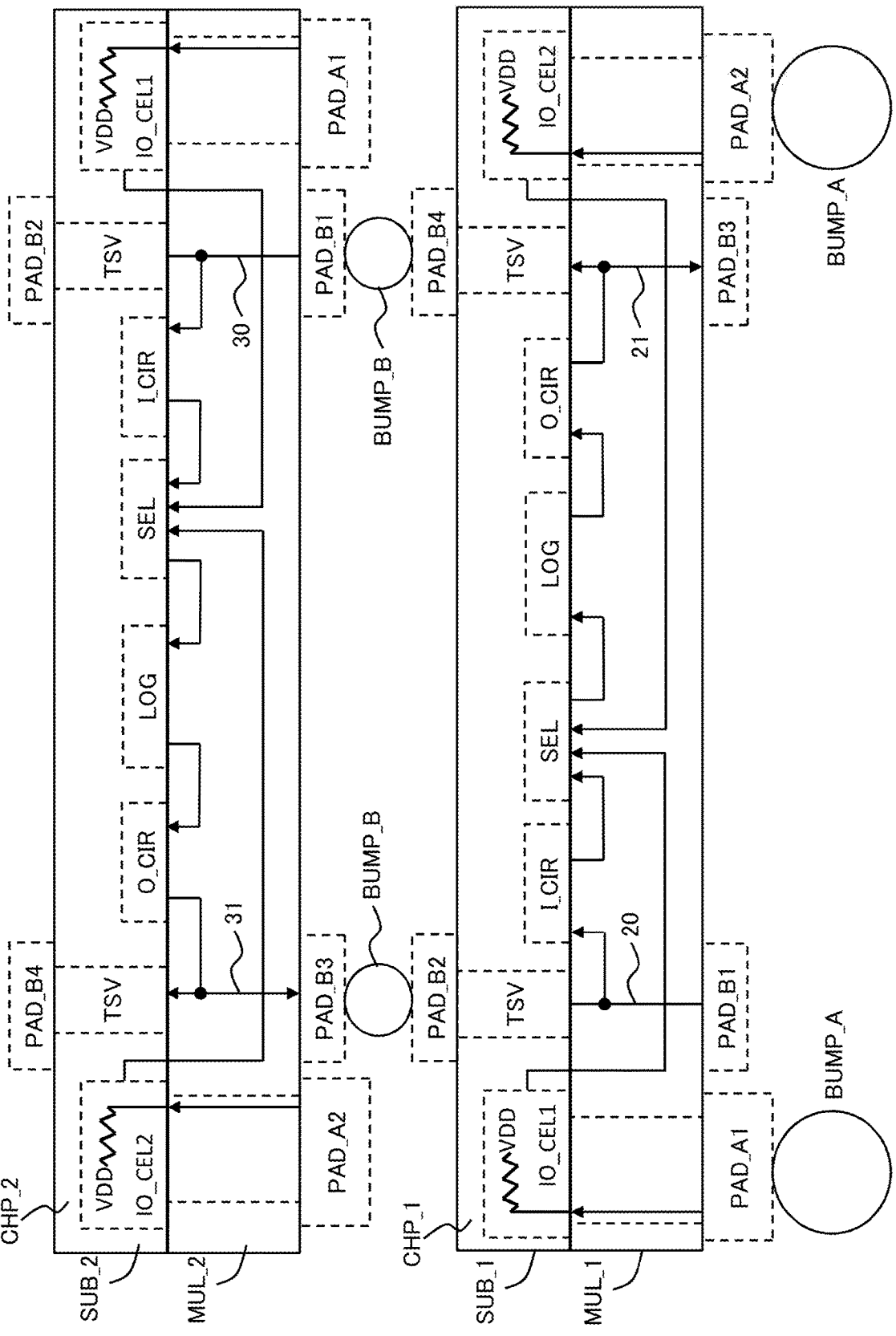
FIG. 10 is a diagram illustrating a cross-section of two stacked chips in a semiconductor device in which a plurality of chips according to the second embodiment (the chips in FIG. 9) are stacked.
Figure 11:
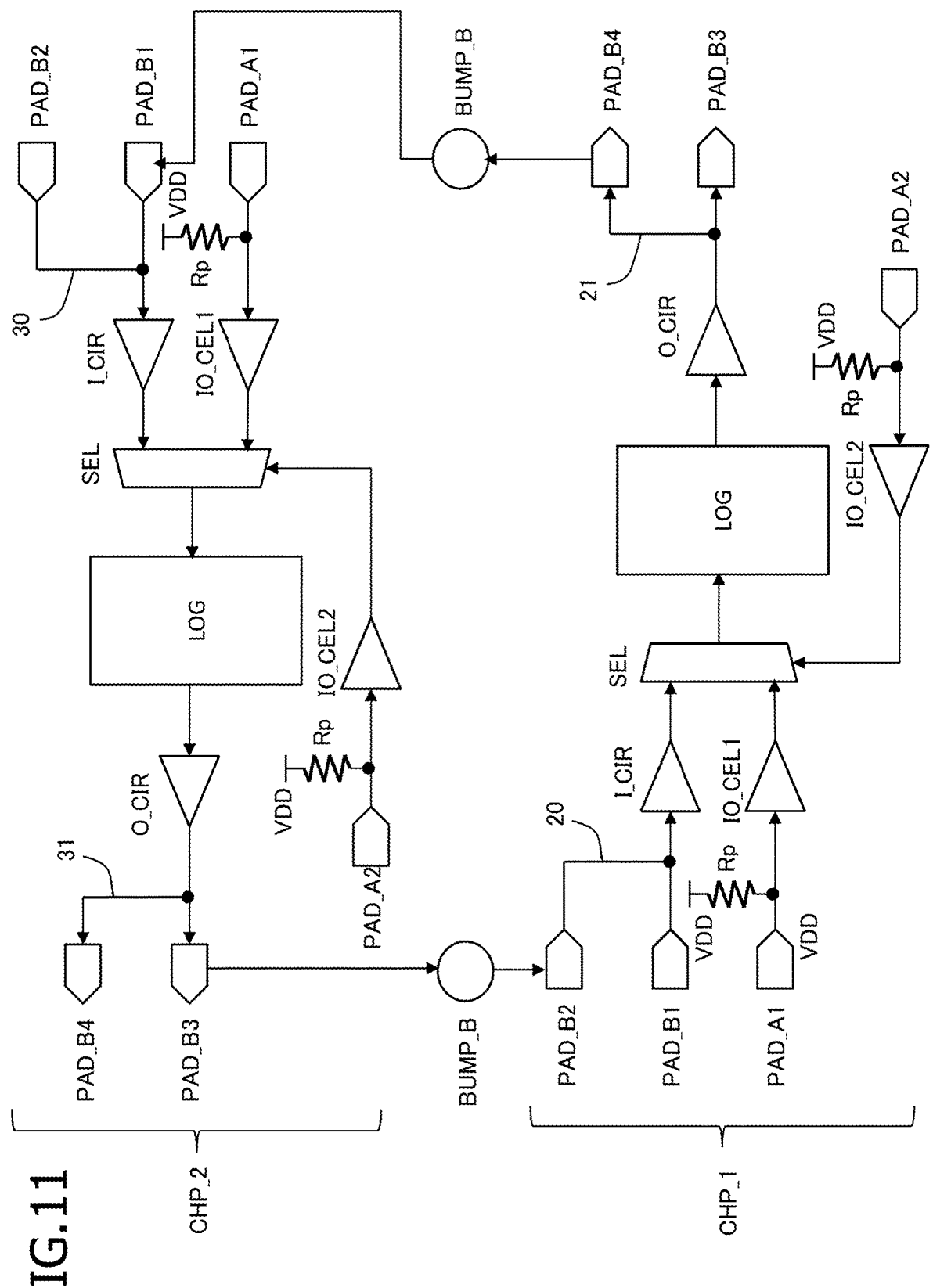
FIG. 11 is a diagram illustrating the circuitry in a state where the two chips in FIG. 10 are stacked.

FIG. 10 is a diagram illustrating a cross-section of two stacked chips in a semiconductor device in which a plurality of chips according to the second embodiment (the chips in FIG. 9) are stacked. FIG. 11 is a diagram illustrating the circuitry in a state where the two chips in FIG. 10 are stacked.

In FIGS. 10 and 11, similarly to FIGS. 5 and 7, the rear surface-side micro-bump pad PAD_B2 of the lower-side chip CHP_1 and the front surface-side micro-bump pad PAD_B3 of the upper-side chip CHP_2 are connected via the micro-bump BUMP_B. Furthermore, the rear surface-side micro-bump pad PAD_B4 of the lower-side chip CHP_1 and the front surface-side micro-bump pad PAD_B1 of the upper-side chip CHP_2 are connected via the micro-bump BUMP_B.

Therefore, the front surface-side micro-bump pad PAD_B1 of the lower-side chip CHP_1 and the rear surface-side micro-bump pad PAD_B2 of the upper-side chip CHP_2 are both connected to the output terminal of the output circuit O_CIR of the other chip CHP_2, CHP_1 stacked therewith, and hence are not in an electrically open state. Consequently, the pads PAD_B1, PAD_B2 connected to the input of the input circuit I_CIR are not connected to the power wire VDD (or ground wire) via a pull-up resistance Rp (or pull-down resistance).

On the other hand, the C4 bump pads PAD_A1, PAD_2 of the lower-side chip CHP_1 are connected via C4 bumps BUMP_A to pads on the substrate (not illustrated), and each receive an input signal. However, the C4 bump pads PAD_A1, PAD_A2 of the upper-side chip CHP_2 are not connected to anywhere and are in an open state. Nevertheless, the input terminals of the input/output cells IO_CEL1, IO_CEL2, to which the pads PAD_A1, PAD_A2 are connected, are connected to the power wire VDD (or ground wire) via a pull-up resistance Rp (or pull-down resistance). Therefore, breakdown of the gate insulation film of the input CMOS circuit in the input/output cell, due to static electricity, is suppressed.

Consequently, no pull-up resistance Rp, or the like, is connected in the connection path between the chips passing via the micro-bump pads PAD_B, and high-frequency signals can be propagated. On the other hand, the C4 bump pads PAD_A, although exposed externally and capable of assuming an open state, are connected to the wire via the resistance element Rp and hence there is little risk of breakdown due to static electricity.

As illustrated in FIG. 11, even if static electricity is applied to the pad PAD_B1 of the lower-side chip CHP_1, this static electricity is able to escape along a path including the pad PAD_B2, the micro-bump BUMP_B, the pad PAD_B3 of the upper-side chip CHP_2, and the output terminal of the output circuit O_CIR. Similarly, even if static electricity is applied to the pad PAD_B2 of the upper-side chip CHP_2, this static electricity is able to escape along a path including the pad PAD_B1, the micro-bump BUMP_B, the pad PAD_B4 of the lower-side chip CHP_1, and the output terminal of the output circuit O_CIR.

If a three-layer structure is adopted by stacking a third circuit having the same configuration as the lower-side chip CHP_1, on top of the stacked structure of the two chips illustrated in FIG. 10, then similarly to the configuration illustrated in FIG. 8, it is needed to ensure that the two pads PAD_B1, PAD_B2, which are connected to the input terminal of the input circuit in the chip sandwiched between the upper and lower chips, are in an unconnected state with respect to the upper-side chip or the lower-side chip, in order to avoid these pads being connected commonly to the outputs of the output circuits in both the upper and lower chips.

Third Embodiment

Figure 12:
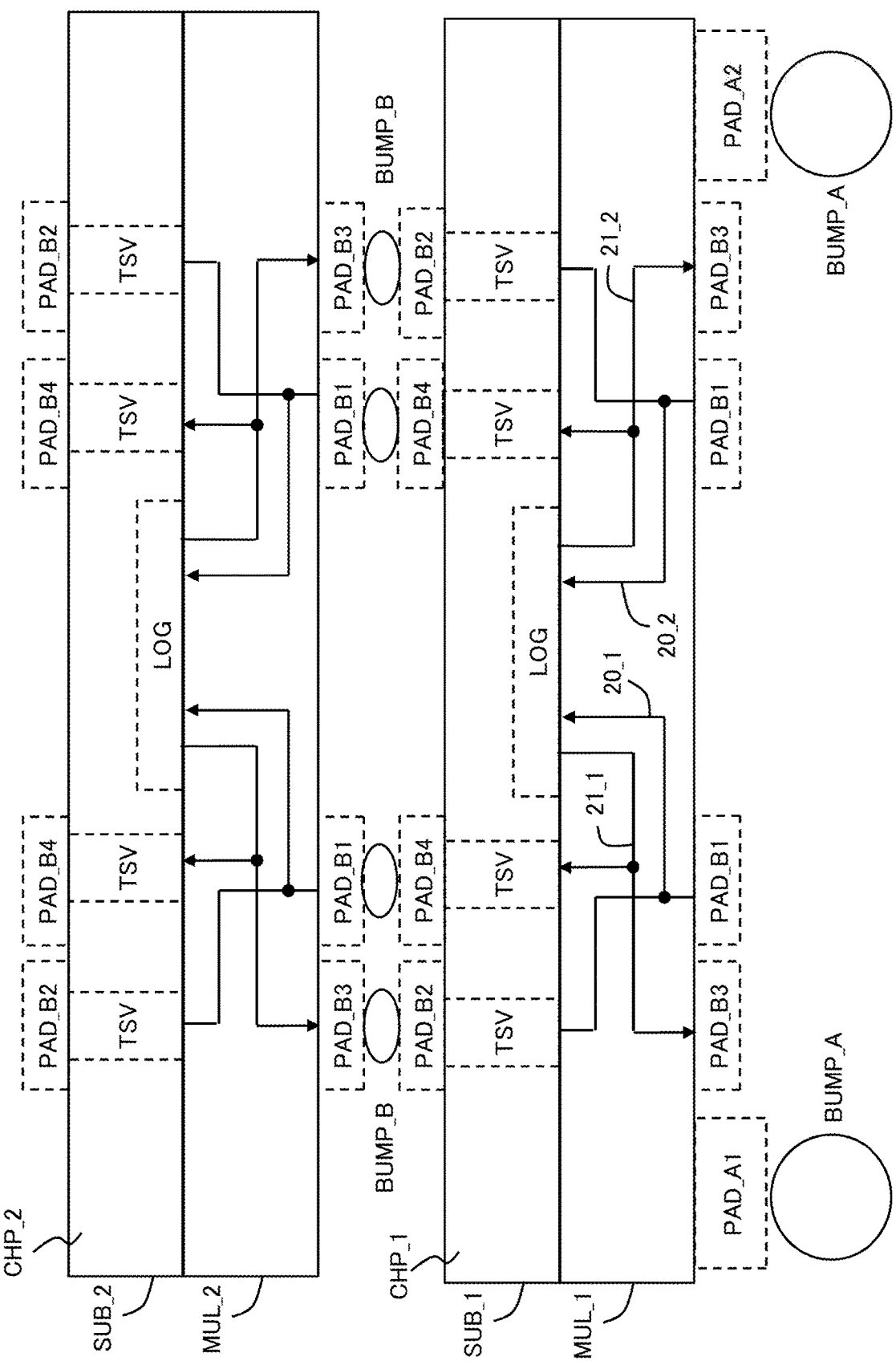
FIG. 12 is a diagram illustrating the cross-sectional structure of a semiconductor device in which two chips according to a third embodiment are stacked.
Figure 13:
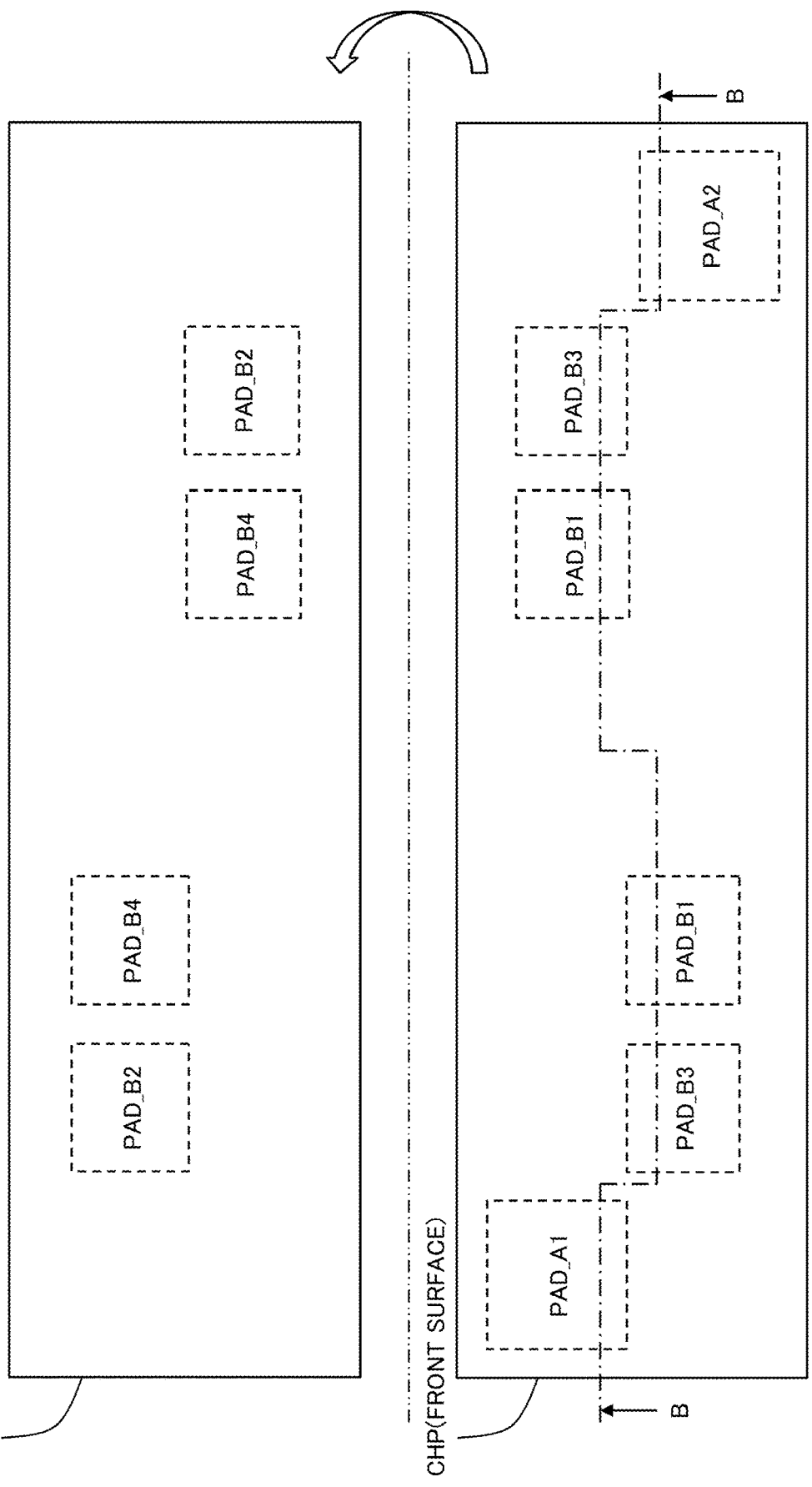
FIG. 13 is a plan diagram illustrating the configuration of the rear surface side and the front surface side of the two chips in FIG. 12.

FIG. 12 is a diagram illustrating the cross-sectional structure of a semiconductor device in which two chips according to a third embodiment are stacked. Furthermore, FIG. 13 is a plan diagram illustrating the configuration of the rear surface side and the front surface side of the two chips in FIG. 12. FIG. 12 is a cross-sectional diagram along the single-dotted line B-B in FIG. 13. In the plan diagram in FIG. 13, the rear surface and the front surface are inverted along the double-dotted line.

In the first and second embodiments, as illustrated in FIG. 6, the front surface-side micro-bump pad PAD_B1 and the rear surface-side micro-bump pad PAD_B2, which are connected to the input terminal of the same input circuit, are provided at the same position in plan view. Similarly, the front surface-side micro-bump pad PAD_B3 and the rear surface-side micro-bump pad PAD_B4, which are connected to the output of the same output circuit, are provided at the same position in plan view.

On the other hand, in the third embodiment, as illustrated in FIG. 13, the front surface-side micro-bump pad PAD_B1 and the rear surface-side micro-bump pad PAD_B2 which are connected to the input of the same input circuit, are provided in different positions in plan view. Similarly, the front surface-side micro-bump pad PAD_B3 and the rear surface-side micro-bump pad PAD_B4, which are connected to the output of the same output circuit, are also provided in different positions in plan view.

In order to stack together a plurality of chips, the rear surface-side micro-bump pad PAD_B2 for input, and the front surface-side micro-bump pad PAD_B3 for output, are provided at the same position in plan view, in both chips CHP_1, CHP_2. Similarly, the rear surface-side micro-bump pad PAD_B4 for output and the front surface-side micro-bump pad PAD_B1 for input are provided at the same position in plan view.

In the third embodiment, the front surface-side pad PAD_B1 and the rear surface-side pad PAD_B2, which are connected to the input terminal of the same input circuit I_CIR, are arranged at different positions in plan view, and the front surface-side pad PAD_B3 and the rear surface-side pad PAD_B4, which are connected to the output of the same output circuit O_CIR, are arranged at different positions in plan view. On the other hand, the pads connected to the input terminal of the input circuit and the pads connected to the output terminal of the output circuit, which is connected mutually between different chips, are arranged at the same position in plan view. Therefore, it is possible to stack the lower-side chip CHP_1 and the upper-side chip CHP_2 without rotating same through 180° in the stacking plane. In the cross-sectional diagram, both chips have the same left/right configuration.

As illustrated in the cross-sectional drawings in FIG. 12, the rear surface-side micro-bump pad PAD_B4 for output, which is connected to the output of the output circuit O_CIR of the lower-side chip CHP_1, is connected to the front surface-side micro-bump pad PAD_B1 for input on the upper-side chip CHP_2, via the micro-bump BUMP_B, and is input to the logic circuit LOG. Conversely, the front surface-side micro-bump pad PAD_B3 for output, which is connected to the output of the output circuit O_CIR of the upper-side chip CHP_2, is connected to the rear surface-side micro-bump pad PAD_B2 for input on the lower-side chip CHP_2 via the micro-bump BUMP_B, and is input to the logic circuit LOG.

In the configuration illustrated in FIG. 12, the chips CHP_1, CHP_2 each have two input circuits and input pads, and two output circuits and output pads. This feature is similar to FIG. 2. In FIG. 12, in each input, the front surface-side pad PAD_B1 and the rear surface-side pad PAD_B2 are connected through vias TSV and input signal wires 20_1, 20_2, and in each output, the front surface-side pad PAD_B3 and the rear surface-side pad PAD_B4 are connected through vias TSV and output wires 21_1, 21_2. This feature differs from FIG. 2.

Figure 14:
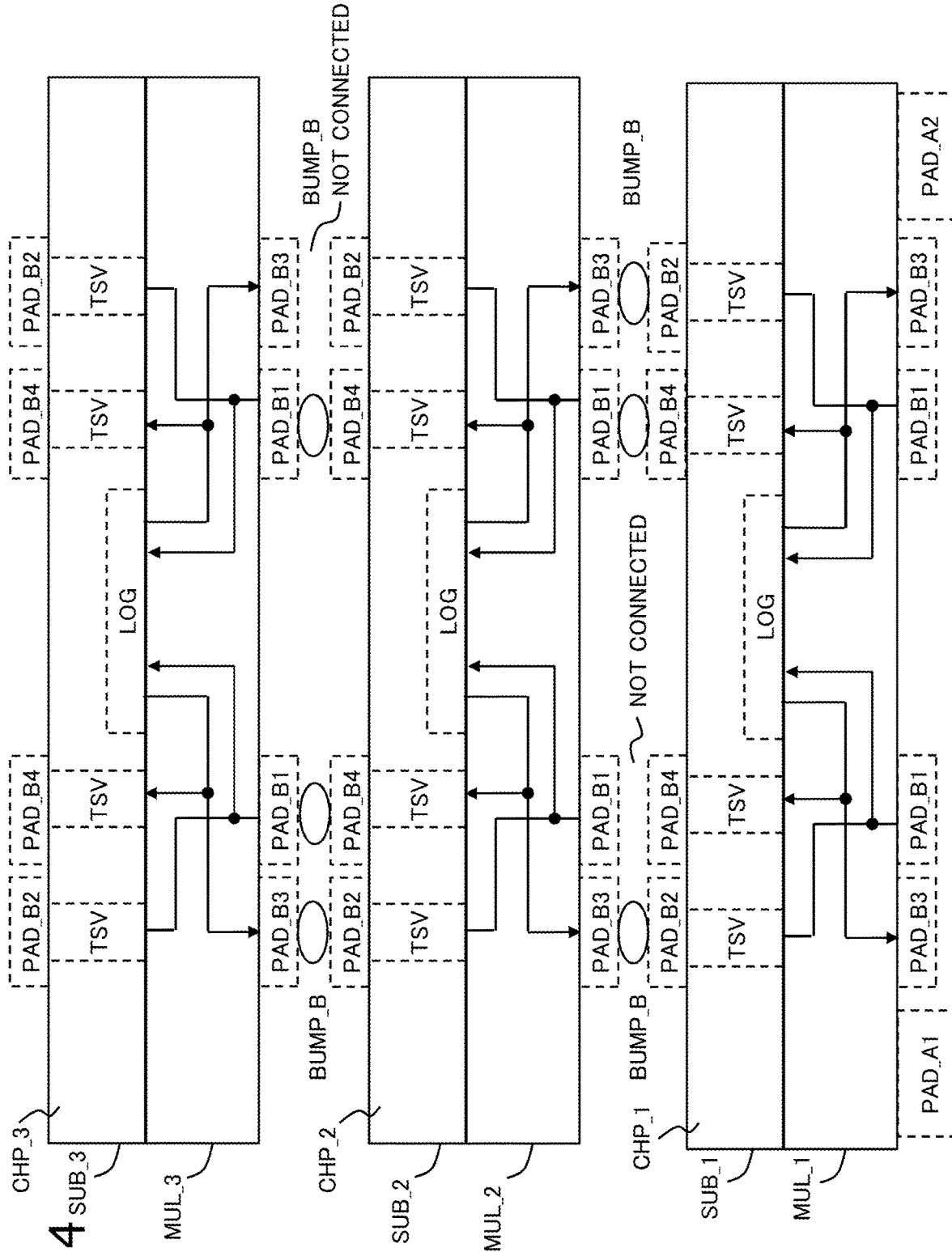
FIG. 14 is a diagram illustrating the cross-sectional structure of a semiconductor device in which a third-layer chip CHP_3 is also stacked on top of the two chips in FIG. 12.

FIG. 14 is a diagram illustrating the cross-sectional structure of a semiconductor device in which a third-layer chip CHP_3 is also stacked on top of the two chips in FIG. 12. In contrast to FIG. 12, in the stacked structure including the bottom-layer chip CHP_1 and the second-layer chip CHP_2, the rear surface-side micro-bump pad PAD_B4 for output on the bottom-layer chip CHP_1 and the front surface-side micro-bump pad PAD_B1 for input on the second-layer chip CHP_2 are in an unconnected state. Similarly, in the stacked structure of the second-layer chip CHP_2 and the third-layer chip CHP_3, the front surface-side micro-bump pad PAD_B3 for output on the third-layer chip CHP_3 and the rear surface-side micro-bump pad PAD_B2 for input on the second-layer chip CHP_2 are in an unconnected state.

In both cases, a configuration is achieved for preventing the outputs of two output circuits from being connected to the input of the same input circuit.

As described above, according to the present embodiment, in the semiconductor device having a three-dimensional LSI in which a plurality of chips are stacked, the pads for chip-to-chip connection which are connected to the input terminal of the input circuit are never in an electrically open state where the plurality of chips are in a stacked state. Therefore, it is not needed to connect to the power wire, or the like, via a pull-up resistance or a pull-down resistance in the connection path in which the pads for chip-to-chip connection are connected, and the signal propagated in the chip-to-chip connection wires can be set to a high frequency.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device comprising:
   a first semiconductor chip including
      a first substrate,
      a first via penetrating through the first substrate,
      a first rear surface-side pad formed on a rear surface side of the first substrate and connected to the first via,
      a first wiring layer formed on a front surface side of the first substrate,
      a first front surface-side pad formed on a front surface side of the first wiring layer,
      a first CMOS circuit formed in the first substrate,
      a second CMOS circuit formed in the first substrate,
      a fourth front surface-side pad formed on the front surface side of the first wiring layer and has size greater than the first front surface-side pad and connected to a certain power wire,
      an input signal wire provided in the first wiring layer which connects the first via, the first front surface-side pad, and an input terminal of the first CMOS circuit, and which does not connect to an output terminal of the second CMOS circuit, and
      a selector circuit configured to select one of a signal from the fourth surface-side pad and a signal from the first CMOS circuit; and
   a second semiconductor chip including
      a second substrate,
      a second wiring layer formed on a front surface side of the second substrate,
      a second front surface-side pad formed on a front surface side of the second wiring layer,
      a third CMOS circuit formed in the second substrate, and
      an output signal wire formed in the second wiring layer which connects the second front surface-side pad to an output terminal of the third CMOS circuit,
   the second semiconductor chip is stacked on a rear surface side of the first semiconductor chip, and the first rear surface-side pad of the first semiconductor chip and the second front surface-side pad of the second semiconductor chip are connected to each other,
   the input terminal of the first CMOS circuit is connected to a gate terminal of the first CMOS circuit, and
   the output terminals of the second and third CMOS circuits are connected to drain terminals of the second and third CMOS circuits respectively.

2. The semiconductor device according to claim 1, further comprising:
   a third semiconductor chip including: a third substrate; a third via penetrating through the third substrate; a third rear surface-side pad formed on a rear surface side of the third substrate and connected to the third via; a third wiring layer formed on a front surface side of the third substrate; and a fourth CMOS circuit formed in the third substrate, the third wiring layer being provided with a third output wire which connects the third via to an output terminal of the fourth CMOS circuit,
   wherein the third semiconductor chip is stacked on a front surface side of the first semiconductor chip, and the first front surface-side pad of the first semiconductor chip and the third rear surface-side pad of the third semiconductor chip are not connected to each other.

3. The semiconductor device according to claim 1, wherein the first front surface-side pad of the first semiconductor chip is not connected to the certain power wire via a resistance element.

4. The semiconductor device according to claim 1,
   wherein the first front surface-side pad and the first rear surface-side pad of the first semiconductor chip are arranged at the same position in plan view, and
   the first semiconductor chip and the second semiconductor chip that are stacked have a position being mutually rotated through 180° in a stacking plane.

5. The semiconductor device according to claim 1,
   wherein the first front surface-side pad and the first rear surface-side pad of the first semiconductor chip are arranged at different positions in plan view, and
   the first semiconductor chip and the second semiconductor chip are stacked in the same positional relationship in a stacking plane.

6. A semiconductor device, comprising:
   a first semiconductor chip including
      a first substrate,
      a first via penetrating through the first substrate,
      a first rear surface-side pad formed on a rear surface side of the first substrate and connected to the first via,
      a first wiring layer formed on the front surface side of the first substrate,
      a first front surface-side pad formed on the front surface side of the first wiring layer,
      a first CMOS circuit formed in the first substrate,
      a second CMOS circuit formed in the first substrate,
      a fourth front surface-side pad formed on the front surface side of the first wiring layer and has a size greater than the first front surface-side pad and connected to a certain power wire,
      an input signal wire provided in the first wiring layer which connects the first via, the first front surface-side pad, and an input terminal of the first CMOS circuit, and which does not connect to an output terminal of the second CMOS circuit, and
      a selector circuit configured to select one of a signal from the fourth surface-side pad and a signal from the first CMOS circuit; and
   a second semiconductor chip including
      a second substrate,
      a second via penetrating through the second substrate,
      a second rear surface-side pad formed on a rear surface side of the second substrate and connected to the second via,
      a second wiring layer formed on a front surface side of the second substrate,
      a third CMOS circuit formed in the second substrate, and
      an output signal wire formed in the second wiring layer which connects the second via to an output terminal of the third CMOS circuit,
   the first semiconductor chip is stacked on a rear surface side of the second semiconductor chip, and the second rear surface-side pad of the second semiconductor chip and the first front surface-side pad of the first semiconductor chip are connected to each other,
   the input terminal of the first CMOS circuit is connected to a gate terminal of the first CMOS circuit, and
   the output terminals of the second and third CMOS circuits are connected to drain terminals of the second and third CMOS circuits respectively.

7. The semiconductor device according to claim 6, further comprising:

a third semiconductor chip including: a third substrate; a third wiring layer formed on a front surface side of the third substrate; a third front surface-side pad formed on a front surface side of the third wiring layer; and a fourth CMOS circuit formed in the third substrate, the third wiring layer being provided with an output signal wire which connects the third front surface-side pad to an output terminal of the fourth CMOS circuit, wherein the third semiconductor chip is stacked on a rear surface side of the first semiconductor chip, and the first rear surface-side pad of the first semiconductor chip and the third front surface-side pad of the third semiconductor chip are not connected to each other.

8. The semiconductor device according to claim 6, wherein the first front surface-side pad of the first semiconductor chip is not connected to the certain power wire via a resistance element.

9. The semiconductor device according to claim 6, wherein the first front surface-side pad and the first rear surface-side pad of the first semiconductor chip are arranged at the same position in plan view, and the first semiconductor chip and the second semiconductor chip that are stacked have a position being mutually rotated through 180° in a stacking plane.

10. The semiconductor device according to claim 6, wherein the first front surface-side pad and the first rear surface-side pad of the first semiconductor chip are arranged at different positions in plan view, and the first semiconductor chip and the second semiconductor chip are stacked in the same positional relationship in a stacking plane.

\* \* \* \* \*